United States Patent
Li et al.

(10) Patent No.: US 11,966,815 B2
(45) Date of Patent: Apr. 23, 2024

(54) METHOD AND APPARATUS FOR CONSTRUCTING QUANTUM CIRCUIT CORRESPONDING TO LINEAR FUNCTION

(71) Applicant: Origin Quantum Computing Technology (Hefei) Co., Ltd, Hefei (CN)

(72) Inventors: Ye Li, Hefei (CN); Yewei Yuan, Hefei (CN); Menghan Dou, Hefei (CN)

(73) Assignee: Origin Quantum Computing Technology (Hefei) Co., Ltd, Hefei (CN)

( * ) Notice: Subject to any disclaimer, the term of this patent is extended or adjusted under 35 U.S.C. 154(b) by 0 days.

(21) Appl. No.: 18/515,886

(22) Filed: Nov. 21, 2023

(65) Prior Publication Data

US 2024/0095571 A1 Mar. 21, 2024

Related U.S. Application Data

(63) Continuation of application No. PCT/CN2022/095134, filed on May 26, 2022.

(30) Foreign Application Priority Data

| May 28, 2021 | (CN) | 202110593126.4 |
| May 28, 2021 | (CN) | 202110595092.2 |
| May 28, 2021 | (CN) | 202110595106.0 |

(51) Int. Cl.
  *H03K 17/92* (2006.01)
  *G06N 10/40* (2022.01)

(52) U.S. Cl.
  CPC ............ *G06N 10/40* (2022.01); *H03K 17/92* (2013.01)

(58) Field of Classification Search
  CPC ........................................................ H03K 17/92
  USPC ........................................................ 327/527
  See application file for complete search history.

(56) References Cited

U.S. PATENT DOCUMENTS 10,325,218 B1 * 6/2019 Zeng ..................... G06N 10/00

FOREIGN PATENT DOCUMENTS

| CN | 107025206 A | 8/2017 |
| CN | 108710951 A | 10/2018 |
| CN | 109165741 A | 1/2019 |
| CN | 112016691 A | 12/2020 |
| CN | 112651509 A | 4/2021 |
| CN | 112819167 A | 5/2021 |

OTHER PUBLICATIONS

International Search Report issued in corresponding PCT Application No. PCT/CN2022/095134, dated Aug. 30, 2022.
Written Opinion issued in corresponding PCT Application No. PCT/CN2022/095134, dated Aug. 30, 2022.

* cited by examiner

*Primary Examiner* — Tomi Skibinski
(74) *Attorney, Agent, or Firm* — Westbridge IP LLC

(57) ABSTRACT

Disclosed are a method and an apparatus for constructing a quantum circuit corresponding to a linear function. The method includes: adding an independent variable of a target linear function on a first qubit; obtaining a second qubit for outputting the target linear function, adding a parametric quantum logic gate acting on the second qubit, and controlling the parametric quantum logic gate by using the first qubit; and determining a parameter value of the parametric quantum logic gate based on the target linear function, to obtain a quantum circuit corresponding to the target linear function.

16 Claims, 6 Drawing Sheets

METHOD AND APPARATUS FOR CONSTRUCTING QUANTUM CIRCUIT CORRESPONDING TO LINEAR FUNCTION

CROSS-REFERENCE TO RELATED APPLICATIONS

This application is a continuation of International Application No. PCT/CN2022/095134, filed on May 26, 2022, which claims priority to Chinese Patent Application No. 202110593126.4, filed on May 28, 2021 and entitled "OPTION PORTFOLIO PAYOFF CALCULATION METHOD AND APPARATUS BASED ON QUANTUM CIRCUIT", claims priority to Chinese Patent Application No. 202110595092.2, filed on May 28, 2021 and entitled "METHOD AND APPARATUS FOR CONSTRUCTING QUANTUM CIRCUIT CORRESPONDING TO LINEAR FUNCTION", and claims priority to Chinese Patent Application No. 202110595106.0, filed on May 28, 2021 and entitled "METHOD AND APPARATUS FOR CONSTRUCTING QUANTUM CIRCUIT CORRESPONDING TO PIECEWISE LINEAR FUNCTION". The disclosures of the aforementioned applications are hereby incorporated by reference in their entireties.

TECHNICAL FIELD

The present disclosure pertains to the field of quantum computation technologies, and in particular, to a method and an apparatus for constructing a quantum circuit corresponding to a linear function.

BACKGROUND

Quantum computers are physical apparatuses that perform high-speed mathematical and logical operations as well as store and process quantum information in accordance with the laws of quantum mechanics. An apparatus is a quantum computer if the apparatus processes and computes quantum information and runs quantum algorithms. The quantum computers are a key technology under study because they have a capability of processing mathematical problems more efficiently than common computers, for example, the quantum computers can shorten a time period for decoding a Rivest-Shamir-Adleman (RSA) key from hundreds of years to several hours.

Option valuation is a common price prediction means of price underlying assets in the financial field. Currently, option valuation is generally performed by using the classical Monte Carlo method for option estimation. However, the method requires a large quantity of samples in sample collection. As a result, the computation amount of option estimation is increased, and the efficiency of option estimation is reduced.

At present, classical linear functions are widely applied in various scenarios. However, implementation of linear functions in quantum computation is still an urgent problem to be resolved.

SUMMARY

The present disclosure is intended to provide a method and an apparatus for constructing a quantum circuit corresponding to a linear function, to resolve a technical problem of implementing a linear function in quantum computation.

An embodiment of the present application provides a method for constructing a quantum circuit corresponding to a linear function. The method includes: adding an independent variable of a target linear function on a first qubit; obtaining a second qubit for outputting the target linear function, adding a parametric quantum logic gate acting on the second qubit, and controlling the parametric quantum logic gate by using the first qubit; and determining a parameter value of the parametric quantum logic gate based on the target linear function, to obtain a quantum circuit corresponding to the target linear function.

Another embodiment of the present application provides an apparatus for constructing a quantum circuit corresponding to a linear function. The apparatus includes: an adding module, configured to add an independent variable of a target linear function on a first qubit; an addition module, configured to: obtain a second qubit for outputting the target linear function, add a parametric quantum logic gate acting on the second qubit, and control the parametric quantum logic gate by using the first qubit; and a determining module, configured to determine a parameter value of the parametric quantum logic gate based on the target linear function, to obtain a quantum circuit corresponding to the target linear function.

An embodiment of the present application provides a method for constructing a quantum circuit corresponding to a piecewise linear function. The method includes: adding an independent variable of a target piecewise linear function on a first qubit; constructing, based on the first qubit and a breakpoint of the piecewise linear function, a first quantum sub-circuit for comparing the independent variable with an abscissa of the breakpoint; constructing, based on the first qubit and a comparison bit that is included in the first quantum sub-circuit and that is for outputting a comparison result, a piecewise quantum sub-circuit corresponding to each piece of the linear function in the piecewise linear function; and constructing, based on the first quantum sub-circuit and each piecewise quantum sub-circuit, the quantum circuit corresponding to the piecewise linear function.

Optionally, the adding an independent variable of a target piecewise linear function on a first qubit includes: for a probability distribution of the independent variable of the target piecewise linear function, obtaining $2^N$ sampling points from the probability distribution, and adding independent variable values and probabilities corresponding to the $2^N$ sampling points on N first qubits.

Optionally, the constructing, based on the first qubit and a breakpoint of the piecewise linear function, a first quantum sub-circuit for comparing the independent variable with an abscissa of the breakpoint includes: obtaining an auxiliary bit corresponding to the first qubit, and the comparison bit for outputting the comparison result; and determining, based on the abscissa of the breakpoint, a quantum logic gate of the to-be-constructed first quantum sub-circuit for comparing the independent variable with the abscissa of the breakpoint, and constructing the first quantum sub-circuit in combination with the first qubit, the auxiliary bit, and the comparison bit.

Optionally, the constructing, based on the first qubit and a comparison bit that is included in the first quantum sub-circuit and that is for outputting a comparison result, a piecewise quantum sub-circuit corresponding to each piece of the linear function in the piecewise linear function includes: obtaining a second qubit for outputting the piecewise linear function; correspondingly adding, based on each piece of the linear function in the piecewise linear function, the parametric quantum logic gate acting on the second qubit, and determining the parameter value of the parametric quantum logic gate; and controlling the parametric quantum logic gate by using the first qubit and the comparison bit, to obtain the piecewise quantum sub-circuit corresponding to each piece of the linear function in the piecewise linear function.

Optionally, the piecewise linear function is a payoff function of a target option, and the method further includes: running the quantum circuit, and calculating a payoff of the target option based on a running result of the quantum circuit.

Optionally, the running the quantum circuit, and calculating a payoff of the target option based on a running result of the quantum circuit includes: running the current quantum circuit, and measuring the second qubit of the quantum circuit, to obtain an amplitude of the second qubit; and performing amplitude estimation on the amplitude of the second qubit, obtaining an expectation value of the payoff function, and using the expectation value as the payoff of the target option.

Optionally, the method further includes: converting the payoff of the target option into a present value.

Another embodiment of the present application provides an apparatus for constructing a quantum circuit corresponding to a piecewise linear function. The apparatus includes: an adding module, configured to add an independent variable of a target piecewise linear function on a first qubit; a first construction module, configured to construct, based on the first qubit and a breakpoint of the piecewise linear function, a first quantum sub-circuit for comparing the independent variable with an abscissa of the breakpoint; a second construction module, configured to construct, based on the first qubit and a comparison bit that is included in the first quantum sub-circuit and that is for outputting a comparison result, a piecewise quantum sub-circuit corresponding to each piece of the linear function in the piecewise linear function; and a third construction module, configured to construct, based on the first quantum sub-circuit and each piecewise quantum sub-circuit, the quantum circuit corresponding to the piecewise linear function.

An embodiment of the present application provides an option portfolio payoff calculation method based on a quantum circuit. The method includes: adding a value of a target object and a probability distribution of the value of the target object on a first qubit; determining a first payoff function for each option in an option portfolio of the target object, and determining, based on the first payoff function, a second payoff function corresponding to the option portfolio; constructing and running, based on the first qubit and the second payoff function, a quantum circuit indicating the payoff function; and calculating a payoff of the option portfolio based on a running result of the quantum circuit.

Optionally, the adding a value of a target object and a probability distribution of the value of the target object on a first qubit includes: for the probability distribution of the value of the target object, obtaining $2^N$ sampling points from the probability distribution, and adding values and probabilities corresponding to the $2^N$ sampling points on N first qubits.

Optionally, the determining a first payoff function for each option in an option portfolio of the target object, and determining, based on the first payoff function, a second payoff function corresponding to the option portfolio includes: for each option in the option portfolio, substituting the value of the target object, a strike price, and an option cost into a payoff function corresponding to the option, to obtain the first payoff function; and combining the first payoff functions respectively corresponding to the options, to obtain the second payoff function corresponding to the option portfolio.

Optionally, the constructing and running, based on the first qubit and the second payoff function, a quantum circuit indicating the payoff function includes: constructing the quantum circuit that includes the first qubit and that indicates the payoff function; inputting a preset parameter of the second payoff function into the quantum circuit; and running the current quantum circuit, to obtain the running result of the current quantum circuit.

Optionally, the running the current quantum circuit, to obtain the running result of the current quantum circuit includes: running the current quantum circuit, and measuring the second qubit of the current quantum circuit, to obtain an amplitude of the second qubit.

Optionally, the calculating a payoff of the option portfolio based on a running result of the quantum circuit includes: performing amplitude estimation on the amplitude of the second qubit, obtaining an expectation value of the second payoff function, and using the expectation value as the payoff of the option portfolio.

Optionally, the method further includes: converting the payoff of the option portfolio into a present value.

Another embodiment of the present application provides an option portfolio payoff calculation apparatus based on a quantum circuit. The apparatus includes: an adding module, configured to add a value of a target object and a probability distribution of the value of the target object on a first qubit; a determining module, configured to: determine a first payoff function for each option in an option portfolio of the target object, and determine, based on the first payoff function, a second payoff function corresponding to the option portfolio; a running module, configured to construct and run, based on the first qubit and the second payoff function, a quantum circuit indicating the payoff function; and a calculation module, configured to calculate a payoff of the option portfolio based on a running result of the quantum circuit.

Another embodiment of the present application provides a storage medium. The storage medium stores a computer program. When the computer program is run, the method according to any one of the foregoing implementations is performed.

Another embodiment of the present application provides an electronic apparatus, including a memory and a processor. The memory stores a computer program. When the processor is configured to run the computer program, the method according to any one of the foregoing implementations is performed.

Optionally or alternatively, the method for constructing a quantum circuit corresponding to a linear function provided herein can be used to implement representation of a linear function in a quantum computation field and fill the gaps in related technologies.

Optionally or alternatively, the method for constructing a quantum circuit corresponding to a piecewise linear function provided herein can be used to implement representation of a piecewise linear function in a quantum computation field and fill the gaps in related technologies.

Optionally or alternatively, the option portfolio payoff calculation method based on a quantum circuit is provided herein. In an embodiment, an option payoff can be calculated based on a quantum circuit in a case of a large quantity of samples, to accelerate the calculation in parallel and improve the efficiency and the accuracy of option calculation. In addition, payoffs of a plurality of option portfolios are calculated, thereby implementing good versatility.

DETAILED DESCRIPTION OF THE EMBODIMENTS

Embodiments described below with reference to the accompanying drawings are exemplary and merely used to explain the present application, but cannot be understood as a limitation on the present application.

The embodiments herein first provide a method for constructing a quantum circuit corresponding to a linear function. The method may be applied to an electronic device, for example, a computer terminal, specifically, a common computer or a quantum computer.

Figure 1:
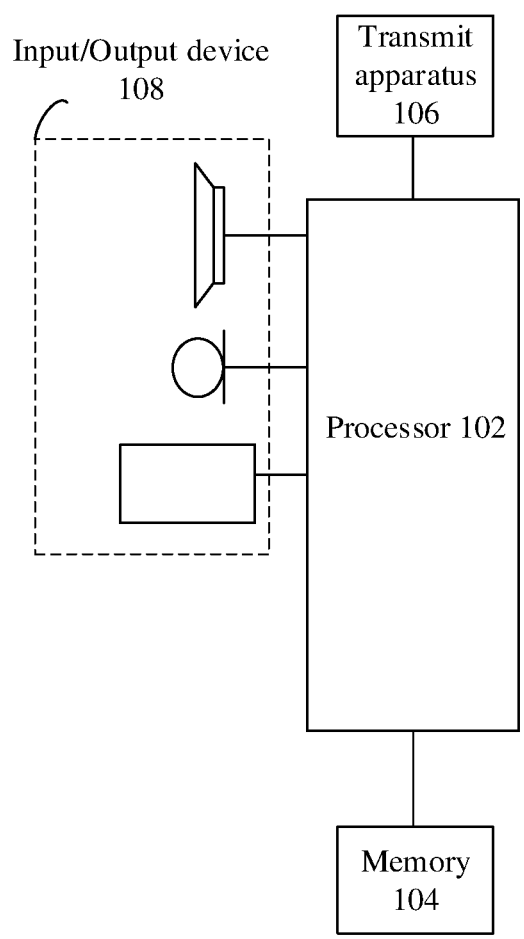
FIG. 1 is a block diagram of a hardware structure of a computer terminal in a method for constructing a quantum circuit corresponding to a linear function according to an embodiment.

The following describes the method in detail by using an example in which the method is run on a computer terminal. FIG. 1 is a block diagram of a hardware structure of a computer terminal in a method for constructing a quantum circuit corresponding to a linear function according to an embodiment. As shown in FIG. 1, the computer terminal may include one or more processors 102 (only one processor is shown in FIG. 1) (the processor 102 may include but is not limited to a processing apparatus such as a microcontroller unit (Microcontroller Unit, MCU) or a field programmable gate array (Field Programmable Gate Array, FPGA), and a memory 104 configured to store an option estimation method based on a quantum circuit. Optionally, the computer terminal may further include a transmit apparatus 106 and an input/output device 108 that are configured to implement a communication function. A person of ordinary skill in the art may understand that the structure shown in FIG. 1 is merely an example and does not constitute any limitation on a structure of the computer terminal. For example, the computer terminal may alternatively include more or fewer components than those shown in FIG. 1, or have a configuration different from that shown in FIG. 1.

The memory 104 may be used to store a software program and a software module of application software, for example, program instructions/modules corresponding to the method for constructing a quantum circuit corresponding to a linear function in the embodiments of the present application. By running the software program and the software module stored in the memory 104, the processor 102 executes various functional applications and data processing, that is, implements the foregoing method. The memory 104 may include a high-speed random access memory, and may further include a non-volatile memory, for example, one or more disk storage apparatus, a flash memory, or another non-volatile solid-state memory. In some examples, the memory 104 may further include a memory that is remotely disposed relative to the processor 102, and the remote memory may be connected to the computer terminal via a network. Examples of the network include but are not limited to the Internet, a corporate intranet, a local area network, a mobile communication network, and a combination thereof.

The transmit apparatus 106 is configured to send or receive data over a network. A specific example of the network may include a wireless network provided by a communication provider of a computer terminal. In an example, the transmit apparatus 106 includes a network interface controller (Network Interface Controller, NIC). The network interface controller may be connected to another network device through a base station to communicate with the Internet. In an example, the transmit apparatus 106 may be a radio frequency (Radio Frequency, RF) module. The radio frequency module is configured to communicate with the Internet in a wireless manner.

It should be noted that a real quantum computer is a hybrid structure that includes two main parts: One is a classical computer responsible for classical computation and control. The other is a quantum device responsible for running quantum programs to implement quantum computation. The quantum program is an instruction sequence that is written in a quantum language such as the QRunes language and that may be run on the quantum computer. In this way, quantum logic gate operations are supported, and ultimately quantum computation is implemented. Specifically, the quantum program is an instruction sequence through which quantum logic gates are operated in a specific time sequence.

In actual application, limited by the development of hardware of a quantum device, quantum computation simulation often needs to be performed to verify a quantum algorithm, quantum application, and the like. The quantum computation simulation is a process in which virtual architecture (that is, a quantum virtual machine) built by using resources of a common computer realizes simulation of running a quantum program corresponding to a specific problem. Generally, the quantum program corresponding to the specific problem needs to be constructed. The quantum program in this embodiment herein is a program that is written in a classical language and that indicates qubits and their evolution. Herein, qubits, quantum logic gates, and the like related to quantum computation are all represented by corresponding classical code.

The quantum circuit, as an embodiment of the quantum program, is also known as a quantum logic circuit and is the most commonly used general quantum computation model. The quantum circuit means a circuit that operates qubits from an abstract concept, and includes qubits, lines (timelines), and various quantum logic gates. Finally, a result usually needs to be read through a quantum measurement operation.

A conventional circuit is connected through metallic wires to transmit voltage signals or current signals. Different from the conventional circuit, the quantum circuit may be considered to be connected by time. To be specific, a state of a qubit evolves naturally with time. This process proceeds according to an instruction of the Hamiltonian operator until the qubit is operated by a logic gate.

One quantum program as a whole corresponds to one total quantum circuit. The quantum program indicates the total quantum circuit. A total quantity of qubits in the total quantum circuit is the same as a total quantity of qubits in the quantum program. It may be understood that one quantum program may include a quantum circuit, a measurement operation for qubits in the quantum circuit, a register for saving a measurement result, and a control flow node (a jump instruction), and one quantum circuit may include tens of or hundreds of or even thousands of quantum logic gate operations. An execution process of the quantum program is a process of executing all quantum logic gates in a specific time sequence. It should be noted that the time sequence is a sequence of time at which an individual quantum logic gate is executed.

It should be noted that in classical computation, the most basic unit is a bit, and the most basic control mode is a logic gate. A purpose of controlling a circuit may be achieved through a combination of logic gates. Similarly, a manner of processing the qubit is the quantum logic gate. The use of the quantum logic gate enables the evolution of a quantum state. The quantum logic gate is a base for forming the quantum circuit. The quantum logic gate includes single-bit quantum logic gates such as the Hadamard gate (H gate, Hadamard gate), the Pauli-X gate (X gate), the Pauli-Y gate (Y gate), the Pauli-Z gate (Z gate), the RX gate, the RY gate, and the RZ gate; and multi-bit quantum logic gates such as the CNOT gate, the CR gate, the iSWAP gate, or the Toffoli gate. The quantum logic gate is generally represented by using a unitary matrix. The unitary matrix is not only a matrix form but also an operation and a transform. Generally, an action of the quantum logic gate on a quantum state is calculated by left multiplying a unitary matrix by a matrix corresponding to a quantum state ket.

Figure 2:
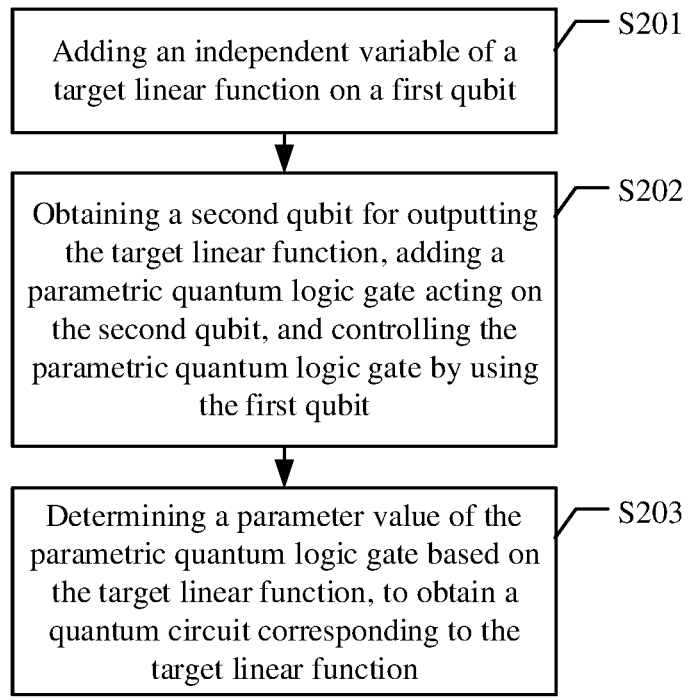
FIG. 2 is a schematic flowchart of a method for constructing a quantum circuit corresponding to a linear function according to an embodiment.

FIG. 2 is a schematic flowchart of a method for constructing a quantum circuit corresponding to a linear function according to an embodiment. The method may include the following steps:

S201: Adding an independent variable of a target linear function on a first qubit.

Optionally, values of the independent variable may correspond to different probabilities. For a probability distribution of the independent variable of the target linear function, $2^N$ sampling points may be obtained from the probability distribution, and independent variable values and probabilities corresponding to the $2^N$ sampling points may be added on N first qubits (or referred to as sampling bits).

For example, in a financial scenario, a target piecewise linear function may be a payoff function of an option of a target object, and an independent variable is a value of the target object.

The target object includes but is not limited to: a financial product, a financial derivative, an underlying asset, and the like. Probability distribution data of the value of the target object is obtained in advance. The value of the target object (such as a share) after a time t can be determined based on an option valuation model (for example, a Black-Scholes-Merton model (Black-Scholes-Merton model)). A specific calculation formula is as follows:

$$S_t = S_0 e^{\sigma W_t + (r - \sigma^2/2)t}$$

Herein, t is an expiration time, $S_t$ is a value of the target object at t, $S_0$ is an initial value, σ is a volatility parameter, $W_t$ is a geometric Brownian motion (GBM) of an asset value of the target object at t, and r is a yield parameter (that is, a risk-free interest rate).

Because a distribution of the Brownian motion $W_t$ is a normal distribution, a distribution of $S_t$ is a log-normal distribution. The value $S_t$ of the target object after the expiration time t is not a single-point value but values of continuous points that meet a continuous probability distribution. To be specific, each point corresponds to a value and a distribution probability (also referred to as a value probability). Therefore, obtaining value probability distribution data corresponding to $S_t$ is obtaining $(S_{t_i}, P_{S_{t_i}})$. Herein, $t_i$ is each time point, $S_{t_i}$ is a value corresponding to each time point, and $P_{S_{t_i}}$ is a corresponding distribution probability. Uniform sampling is performed on the continuous points of $S_t$ in the log-normal distribution, to obtain $2^N$ discrete probability density distribution points, for example, $(S_{t_i}, P_{S_{t_i}})$, where i is 0, 1, . . . , or $2^{N-1}$.

A sum of $2^N$ distribution probabilities is not necessarily 1. In consideration of this, a normalization operation may be performed on the $2^N$ discrete probability density distribution points. To be specific, a ratio of a probability corresponding to each $S_{t_i}$ to a root extracted from a sum of squares of probabilities corresponding to $2^N S_{t_i}$s is used as a normalized probability of each $S_{t_i}$. In this way, $2^N$ discrete sampling points are obtained. Each sampling point includes a value and a value probability corresponding to the value, that is, $(S_{t_i}, P_{S_{t_i}})$.

The $2^N$ points are obtained through uniform sampling based on a probability distribution of $S_t$ in the log-normal distribution. Normalization is performed after a value of a probability density function of each sampling point is obtained. In this way, the discrete distribution of the sampling points can be used to represent the original continuous distribution. The discrete distribution with more sampling points and a larger sampling interval better represents an original distribution pattern.

Then, eigenstates corresponding to the N first qubits can be determined based on the values corresponding to the $2^N$ sampling points, and amplitude values of the eigenstates can be determined based on the value probabilities corresponding to the $2^N$ sampling points, to complete adding of each of the N first qubits.

For example, eight eigenstates corresponding to three sampling bits are first determined based on eight values corresponding to eight sampling points, respectively, |000⟩, |001⟩, |010⟩, |011⟩, |100⟩, |101⟩, |110⟩, and |111⟩. Each eigenstate corresponds to one value. For example, |000⟩ corresponds to a value 1, |001⟩ corresponds to a value 2, . . . , and |111⟩ corresponds to a value 8. An amplitude of a corresponding eigenstate is then determined based on a value probability of each value, to implement quantum amplitude encoding (that is, adding). After the encoding, quantum states of the three sampling bits represent distribution information of the underlying asset at the expiration time.

S202: Obtaining a second qubit for outputting the target linear function, adding a parametric quantum logic gate acting on the second qubit, and controlling the parametric quantum logic gate by using the first qubit.

The second qubit may be one preset qubit that may be referred to as a result bit. The parametric quantum logic gate may be a rotation logic gate, for example, an RY gate.

Optionally, a first parametric quantum logic gate corresponding to an intercept of the target linear function may be added. The first parametric quantum logic gate acts on the second qubit.

A second parametric quantum logic gate corresponding to a slope of the target linear function is separately added. One first qubit corresponds to one second parametric quantum logic gate. The second parametric quantum logic gate acts on the second qubit and is controlled by a corresponding first qubit.

For example, the parametric quantum logic gate is an RY gate. In this case, a quantity of first parametric quantum logic gates may be set to 1, and is not controlled; and a quantity of second parametric quantum logic gates may be the same as a quantity of sampling bits, namely, N, and is controlled by the sampling bits. Because a function value corresponding to the intercept is not related to the independent variable, the corresponding first parametric quantum logic gate is not related to the sampling bits. A function value corresponding to the slope can be calculated only in combination with the independent variable. Therefore, the corresponding second parametric quantum logic gate needs to be associated with the sampling bits.

S203: Determining a parameter value of the parametric quantum logic gate based on the target linear function, to obtain a quantum circuit corresponding to the target linear function.

Optionally, a parameter value of the first parametric quantum logic gate may be determined based on the intercept of the target linear function; and a parameter value of the second parametric quantum logic gate may be determined based on the slope of the target linear function. For example, a parameter value of a rotation logic gate is a rotation angle value in a unitary matrix of the rotation logic gate.

Figure 3:
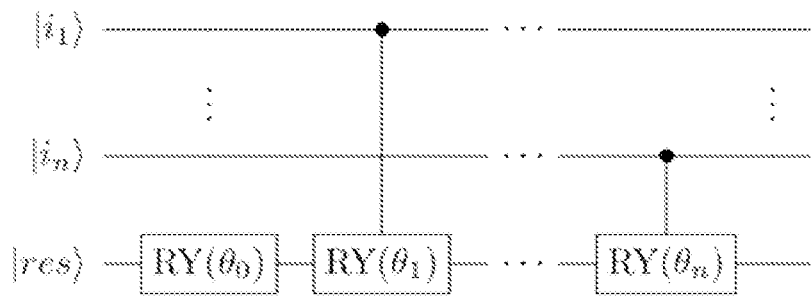
FIG. 3 is a schematic diagram of a quantum circuit corresponding to a linear function according to an embodiment.

For example, FIG. 3 is a schematic diagram of a quantum circuit corresponding to a linear function. The quantum circuit is used to implement a linear function $f(x)$=offset+ slope*x, where x is an independent variable, offset is an intercept, and slope is a slope. Specifically, FIG. 3 includes sampling bits: $i_1, \ldots,$ and $i_n$ which obtained after adding of a distribution of an independent variable, a result bit res, a first parametric quantum logic gate: an $RY(a_0)$ gate, and a second parametric quantum logic gate: an $RY(a_1)$ gate actually controlled by qubit $i_1, \ldots,$ and an $RY(a_n)$ gate actually controlled by qubit $i_n$. Actual control (indicated by using a solid round point) indicates that a quantum logic gate is executed only when a quantum state of a controlling bit is a |1> state before the execution.

For the first parametric quantum logic gate, a parameter $a_0$ in the $RY(a_0)$ gate is mapped to an intercept of a first piece of a linear function (a function value of a left endpoint of a domain), and a parameter $a_1$ to a parameter $a_n$ in the $RY(a_1)$ gate to the $RY(a_n)$ gate are mapped a slope of the first piece of the linear function. A person skilled in the art can understand that, in actual application, a value of the parameter of the RY gate, that is, the rotation angle ranges from 0 to $2\pi$, the value after the mapping can reflect the nature of a trigonometric function, and one-to-one mapping usually can be constructed on a monotonic interval of $\pi/4$.

Finally, the quantum circuit is run, to obtain a quantum state of the result bit res:

$\cos[f(x)]|0\rangle + \sin[f(x)]|1\rangle$

Amplitudes of one or more a |0⟩ state and a |1⟩ state of the result bit may be measured to obtain a linear function value $f(x)$. By using the quantum circuit in the quantum computation field, functions of the linear function are implemented. A specific function value can be correspondingly output for a specific independent variable value.

It can be learned that representation of a linear function in the quantum computation field is implemented, and gaps in related technologies are filled, through adding the independent variable of the target linear function on the first qubit; obtaining the second qubit for outputting the target linear function, adding the parametric quantum logic gate acting on the second qubit, and controlling the parametric quantum logic gate by using the first qubit; and determining the parameter value of the parametric quantum logic gate based on the target linear function, to obtain the quantum circuit corresponding to the target linear function.

Figure 4:
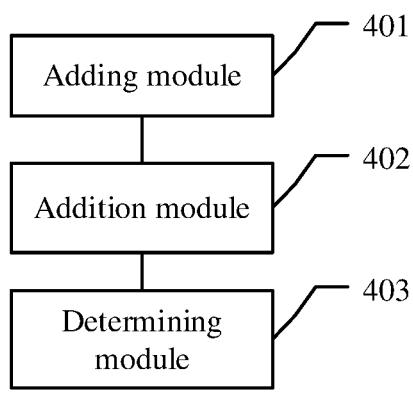
FIG. 4 is a schematic diagram of a structure of an apparatus for constructing a quantum circuit corresponding to a linear function according to an embodiment.

FIG. 4 is a schematic diagram of a structure of an option portfolio payoff calculation apparatus based on a quantum circuit according to an embodiment. Corresponding to the procedure shown in FIG. 2, the apparatus includes: an adding module 401, configured to add an independent variable of a target linear function on a first qubit; an addition module 402, configured to: obtain a second qubit for outputting the target linear function, add a parametric quantum logic gate acting on the second qubit, and control the parametric quantum logic gate by using the first qubit; and a determining module 403, configured to determine a parameter value of the parametric quantum logic gate based on the target linear function, to obtain a quantum circuit corresponding to the target linear function.

Optionally, the adding module is configured to: for a probability distribution of the independent variable of the target linear function, obtain $2^N$ sampling points from the probability distribution, and add independent variable values and probabilities corresponding to the $2^N$ sampling points on N first qubits.

Optionally, the addition module is configured to: add a first parametric quantum logic gate corresponding to an intercept of the target linear function, where the first parametric quantum logic gate acts on the second qubit; and separately add a second parametric quantum logic gate corresponding to a slope of the target linear function, where one first qubit corresponds to one second parametric quantum logic gate, and the second parametric quantum logic gate acts on the second qubit and is controlled by a corresponding first qubit.

Optionally, the determining module is configured to: determine a parameter value of the first parametric quantum logic gate based on the intercept of the target linear function; and determine a parameter value of the second parametric quantum logic gate based on the slope of the target linear function.

Optionally, the parametric quantum logic gate is an RY gate.

For example, the embodiment herein can implement representation of a linear function in the quantum computation field and fill gaps in related technologies.

Another embodiment provides a storage medium. The storage medium stores a computer program. When the computer program is run, the steps in any method embodiment are performed.

Optionally, in this embodiment, the storage medium may be configured to store the computer program for performing the following steps: S1: Adding an independent variable of a target linear function on a first qubit. S2: Obtaining a second qubit for outputting the target linear function, adding a parametric quantum logic gate acting on the second qubit, and controlling the parametric quantum logic gate by using the first qubit. S3: Determining a parameter value of the parametric quantum logic gate based on the target linear function, to obtain a quantum circuit corresponding to the target linear function.

Optionally, in this embodiment, the foregoing storage medium may include but is not limited to any medium that can store a computer program, for example, a USB flash drive, a read-only memory (Read-Only Memory, ROM for short), a random access memory (Random Access Memory, RAM for short), a removable hard disk, a magnetic disk, or an optical disc.

Another embodiment further provides an electronic apparatus, including a memory and a processor. The memory stores a computer program. The processor is configured to run the computer program, to perform the steps in any method embodiment.

Optionally, the electronic apparatus may further include a transmission device and an input/output device. The transmission device is connected to the processor. The input/output device is connected to the processor.

Optionally, in this embodiment, the processor may be configured to perform the following steps by using the computer program: S1: Adding an independent variable of a target linear function on a first qubit. S2: Obtaining a second qubit for outputting the target linear function, adding a parametric quantum logic gate acting on the second qubit, and controlling the parametric quantum logic gate by using the first qubit. S3: Determining a parameter value of the parametric quantum logic gate based on the target linear function, to obtain a quantum circuit corresponding to the target linear function.

For brevity, repetitive description of the same or similar features as those in the foregoing embodiments may be omitted in the following embodiments.

Figure 5:
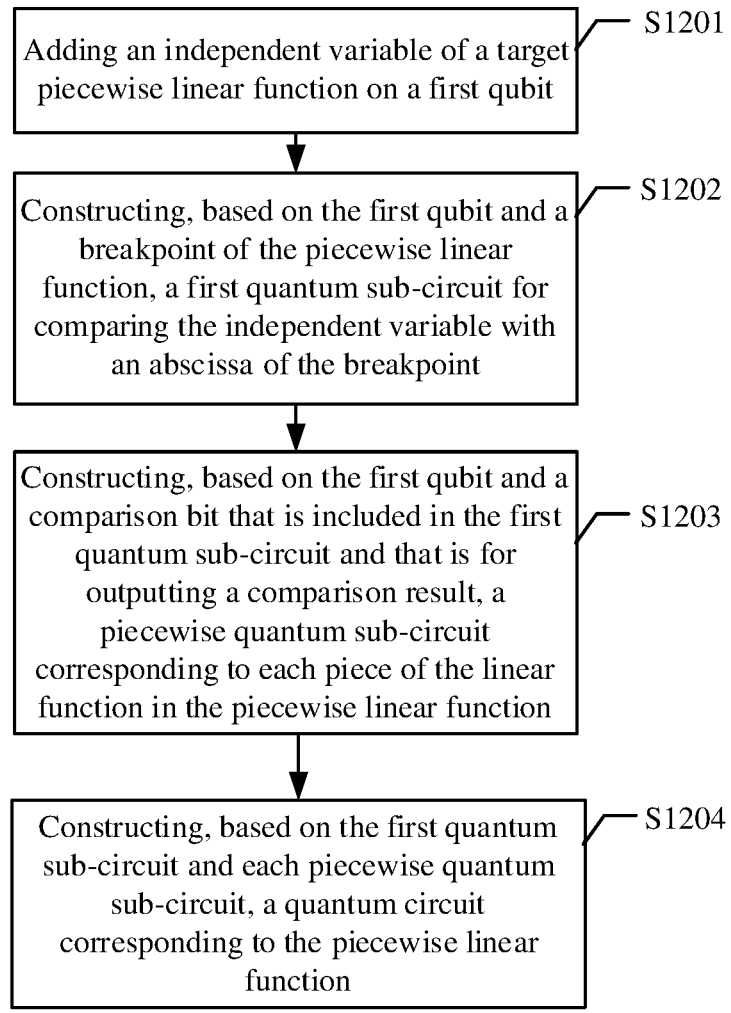
FIG. 5 is a schematic flowchart of a method for constructing a quantum circuit corresponding to a piecewise linear function according to an embodiment.

FIG. 5 is a schematic flowchart of a method for constructing a quantum circuit corresponding to a piecewise linear function according to an embodiment. The method may include the following steps:

S1201: Adding an independent variable of a target piecewise linear function on a first qubit.

S1202: Constructing, based on the first qubit and a breakpoint of the piecewise linear function, a first quantum sub-circuit for comparing the independent variable with an abscissa of the breakpoint.

Optionally, an auxiliary bit corresponding to the first qubit, and the comparison bit for outputting the comparison result may be obtained. For example, a quantity of auxiliary bits and a quantity of first qubits are the same and are both N, and a quantity of comparison bits is set to 1.

A quantum logic gate of the to-be-constructed first quantum sub-circuit for comparing the independent variable with the abscissa of the breakpoint is determined based on the abscissa of the breakpoint. The first quantum sub-circuit is constructed in combination with the first qubit, the auxiliary bit, and the comparison bit. The breakpoint of the piecewise linear function is an intersection point between pieces of the linear function.

Figure 6:
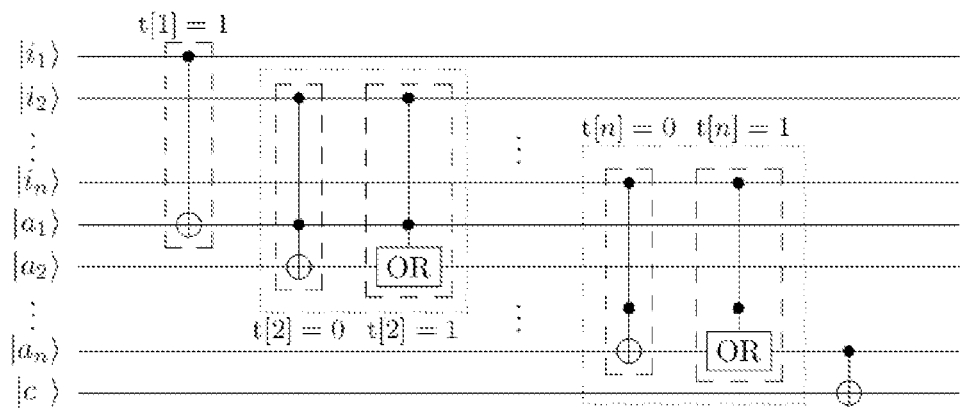
FIG. 6 is a schematic diagram of lines of a comparator in a quantum circuit according to an embodiment.

For example, FIG. 6 is a schematic diagram of lines of a quantum comparator according to an embodiment. A quantum logic gate to act on each corresponding sampling bit and a corresponding auxiliary bit after adding may be sequentially determined based on an encoded value of each bit of a binary complement of an abscissa of a breakpoint. When an encoded value of one bit of the binary complement is 0, a corresponding quantum logic gate is a Toffoli gate. When an encoded value of one bit of the binary complement is 1, a corresponding quantum logic gate is a logic OR gate. It should be noted that only when an encoded value of the first bit of the binary complement is 0, it corresponds to no quantum logic gate operation; or when an encoded value of the first bit of the binary complement is 1, it corresponds to a CNOT gate operation.

Figure 7:
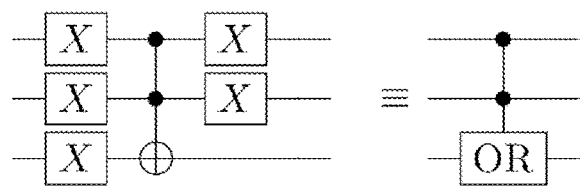
FIG. 7 is a schematic diagram of a logic OR gate according to an embodiment.

During specific implementation, a logical OR gate (OR gate) can be constructed based on a Toffoli gate and an X gate, and other quantum logic gates equivalent to the Toffoli gate or the logical OR gate are also reasonable and feasible. As shown in left-side lines in FIG. 7, a manner of constructing a logical OR gate may sequentially include three NOT gates, one Toffoli gate, and two NOT gates.

As shown in FIG. 6, $|i_1\rangle$, $|i_2\rangle$, . . . , and $|i_n\rangle$ are N sampling bits, $|i_1\rangle$ is a low-order bit, and $|i_n\rangle$ is a high-order bit; and $|a_1\rangle$, $|a_2\rangle$, . . . , and $|a_n\rangle$ are auxiliary bits, $|a_1\rangle$ is a low-order bit, and $|a_n\rangle$ is a high-order bit; and C is a comparison bit. $t[1, \ldots, n]$ represents a group of an n-bit binary complement of the abscissa of the breakpoint, $t[1]$ is a low-order bit, and $t[n]$ is a high-order bit. A quantity of bits of the binary complement of the abscissa of the breakpoint and a quantity of auxiliary bits are the same as and in a one-to-one correspondence with a quantity of sampling bits. The three quantities are all N.

For example, as shown in FIG. 6, when $t[1]=1$, a quantum logic gate to act on the first sampling bit $|i_1\rangle$ and the first auxiliary bit $|a_1\rangle$ is determined to be a CNOT gate; or when $t[1]=0$, there is no need to perform any operation on the first auxiliary bit.

Quantum logic gates for $t[2]$, $t[3]$, . . . , and $t[n]$ are determined based on the same idea. For example, as shown in a dotted-line box in FIG. 6, when $t[2]=1$, a quantum logic gate to act on the second sampling bit, the first auxiliary bit, and the second auxiliary bit is determined to be a logic OR gate; or when $t[2]=0$, a quantum logic gate to act on the second sampling bit, the first auxiliary bit, and the second auxiliary bit is determined to be a Toffoli gate.

By analogy, a quantum logic gate to act on the nth auxiliary bit $|an\rangle$ is determined. Then, $|an\rangle$ is added on the comparison bit by using the final CNOT gate. To be specific, a result of comparison between the independent variable and a value of the abscissa of the breakpoint is added on the comparison bit c. For example, a $|0\rangle$ state is obtained after the comparison bit c is measured. It indicates that the independent variable is less than the abscissa of the breakpoint. Otherwise, a $|1\rangle$ state is obtained. It indicates that the independent variable is greater than or equal to the abscissa of the breakpoint.

S1203: Constructing, based on the first qubit and a comparison bit that is included in the first quantum sub-circuit and that is for outputting a comparison result, a piecewise quantum sub-circuit corresponding to each piece of the linear function in the piecewise linear function.

Optionally, a second qubit for outputting the piecewise linear function may be obtained.

The second qubit may be one preset qubit that may be referred to as a result bit.

A parametric quantum logic gate acting on the second qubit is correspondingly added based on each piece of the linear function in the piecewise linear function. A parameter value of the parametric quantum logic gate is determined.

Each piece of the linear function corresponds to one group of parametric quantum logic gate, for example, a rotation logic gate. A parameter value (rotation angle) of the parametric quantum logic gate may be determined based on an intercept and a slope of each piece of the linear function.

The parametric quantum logic gate is controlled by using the first qubit and the comparison bit, to obtain the piecewise quantum sub-circuit corresponding to each piece of the linear function in the piecewise linear function.

In each group of parametric quantum logic gates, a logic gate related to the intercept is not controlled by the first qubit; and a logic gate related to the slope is controlled by the first qubit, and is selectively controlled by the comparison bit according to a specific status of each piece of the linear function.

Figure 8:
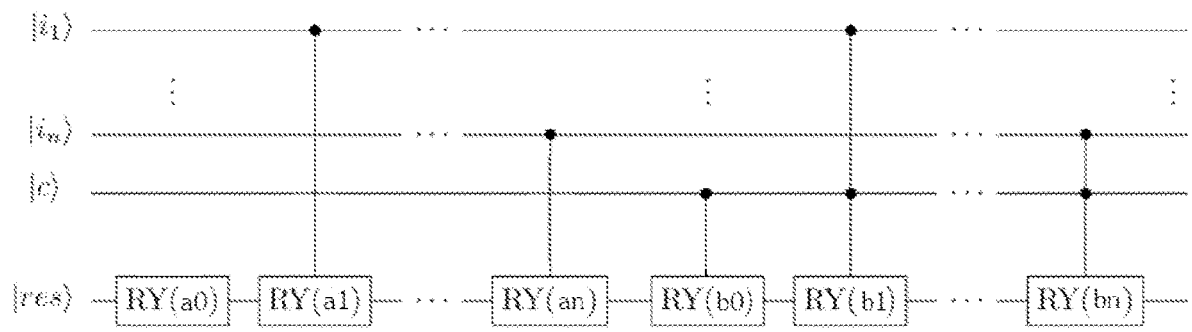
FIG. 8 is a schematic diagram of a piecewise quantum sub-circuit according to an embodiment.

For example, the target piecewise linear function includes two pieces of linear functions. FIG. 8 is a schematic diagram of a structure of a corresponding piecewise quantum sub-circuit. FIG. 8 includes sampling bits: ii, . . . , in which obtained after adding, a comparison bit c, and a result bit res; and further includes two groups of quantum logic gates: RY gates. A first group includes an $RY(a_0)$ gate, an $RY(a_1)$ gate actually controlled by qubit ii, . . . , and an $RY(a_n)$ gate actually controlled by qubit $i_n$. Actual control (indicated by using a solid round point) indicates that a quantum logic gate is executed only when a quantum state of a controlling bit is a |1> state before the execution. The first group corresponds to a first piece of the piecewise linear function, that is, a first-piece piecewise quantum sub-circuit. A second group includes an $RY(b_0)$ gate, an $RY(b_1)$ gate actually controlled by $i_1$ and c, . . . , and an $RY(b_n)$ gate actually controlled by in and c. The second group corresponds to a second piece of the piecewise linear function, that is, a second-piece piecewise quantum sub-circuit. Because the independent variable is less than the abscissa of the breakpoint, the first group of logic gates corresponding to the first piece of linear function are not related to the comparison bit. Only after the independent variable is greater than the abscissa of the breakpoint, the second piece of linear function corresponding to the second group of logic gates is executed. In this case, the second group of logic gates need to be related to the comparison bit.

For the first group of logic gates, a parameter $a_0$ in the $RY(a_0)$ gate is mapped to an intercept of the first piece of linear function (a function value of a left endpoint of a domain), and a parameter $a_1$ to a parameter $a_n$ in the $RY(a_1)$ gate to the $RY(a_n)$ gate are mapped to a slope of the first piece of linear function. Parameters of the second group of logic gates are similarly determined. It should be noted that $b_0$ is mapped to a function value obtained through subtracting a function value of a left endpoint of the previous piece of function from a function value of a breakpoint between the second piece of function and the first piece of function, and $b_1$ to $b_n$ are mapped to a slope value obtained through subtracting a slope of the previous piece of function from a slope of the second piece of function. For a linear function including more than two pieces, a comparison bit corresponding to a new breakpoint is correspondingly added, and so on. A person skilled in the art can understand that, in actual application, a value of the parameter of the RY gate, that is, the rotation angle ranges from 0 to $2\pi$, the value after the mapping can reflect the nature of a trigonometric function, and one-to-one mapping usually can be constructed on a monotonic interval of $\pi/4$.

A quantum comparator circuit and piecewise quantum sub-circuits are sequentially run, to finally measure the result bit res, thereby obtaining a quantum state and an amplitude corresponding to the result bit.

S1204: Constructing, based on the first quantum sub-circuit and each piecewise quantum sub-circuit, a quantum circuit corresponding to the piecewise linear function.

Optionally, the target piecewise linear function may be a payoff function $f(S_T)$ of a target option. In actual application, the quantum circuit may be further run, and a payoff of the target option may be calculated based on a running result of the quantum circuit.

An European option is used as an example. There are four basic option transactions whose payoff functions $f(S_t)$ are as follows:

A call payoff of buying the European option is $f(S_t)=\max\{0, S_t-K\}-C$.
A put payoff of buying the European option is $f(S_t)=\max\{K-S_t, 0\}-C$.
A call payoff of selling the European option is $f(S_t)=C-\max\{0, S_t-K\}$.
A put payoff of selling the European option is $f(S_t)=C-\max\{K-S_t, 0\}$.

Herein, $S_t$ is an option value, K is a strike price, and C is an option cost. It can be learned that one option corresponds to one payoff function that is a piecewise linear function.

For example, a payoff function of buying a call option is as follows:

$$f_0(S_t) = \begin{cases} -1, & 0 < S_t \leq 1 \\ S_t - 2, & 1 < S_t \end{cases}$$

Herein, a strike price $K_0$ is equal to 1, an option cost $C_0$ is equal to 1, a left endpoint is 0, a function value of the left endpoint is −1, and an abscissa of a breakpoint is the strike price: 1.

A payoff function of selling a call option is as follows:

$$f_1(S_t) = \begin{cases} 2, & 0 < S_t \leq 2 \\ 4 - S_t, & 2 < S_t \end{cases}$$

Herein, a strike price $K_1$ is equal to 2, an option cost $C_1$ is equal to 2, a left endpoint is 0, a function value of the left endpoint is 2, and an abscissa of a breakpoint is the strike price: 2.

Optionally, a current quantum circuit may be run, and a second qubit of the quantum circuit may be measured, to obtain an amplitude of the second qubit; and amplitude estimation may be performed on the amplitude of the second qubit, an expectation value $E[f(S_T)]$ of the payoff function may be obtained, and the expectation value may be used as the payoff of the target option.

The amplitude estimation can be implemented by using a quantum amplitude estimation algorithm (Quantum Amplitude Estimation, QAE) and an improved version or a variant of the quantum amplitude estimation algorithm. A preferred manner is specifically as follows: obtaining a current angle upper limit value and a current angle lower limit value corresponding to the amplitude value of the result bit, and calculating a first difference between the current angle upper limit value and the current angle lower limit value as a target difference; when the target difference is greater than a preset precision threshold, determining, based on a preset intermediate variable parameter, the current angle upper limit value, and the current angle lower limit value, a next angle amplification factor and a next flag parameter corresponding to a next iteration step; controlling a preset amplification quantum circuit to amplify a quantum circuit of the result bit by the next angle amplification factor, and measuring a quantum state of the result bit in a quantum circuit of an amplified result bit based on a preset total quantity of observation times; calculating a second difference between a next angle upper limit value and a next angle lower limit value of the amplitude value of the result bit as a target difference based on the current angle upper limit value, the current angle lower limit value, the next angle amplification factor, the next flag parameter, and a measured result of the quantum state of the result bit, until the target difference is not greater than the precision threshold.

Determining the amplitude value of the result bit based on the measured result of the quantum state of the result bit.

In the amplitude value estimation method for the qubit (that is, the result bit) in the foregoing steps, an amplification parameter of an amplification quantum circuit in each iteration step is determined and continuous iteration is performed, to make a difference between an angle upper limit value and an angle lower limit value not greater than the precision threshold. In this way, a problem that an amplitude value cannot converge is avoided, and precision of an estimated amplitude value is improved. For a principle of this process and a more detailed implementation process, refer to Chinese Patent Application No. 202011591351.6, filed on Dec. 29, 2020 and entitled "METHOD AND APPARATUS FOR AMPLITUDE ESTIMATION OF QUANTUM CIRCUIT, STORAGE MEDIUM, AND ELECTRONIC APPARATUS". Details are not described herein again. Optionally, in actual application, the payoff of the target option may be further converted into a present value. A conversion formula may be $E[f(S_T)] *e^{-rt}$.

In an embodiment, representation of a linear function in the quantum computation field can be implemented, and the gaps in related technologies can be filled.

Figure 9:
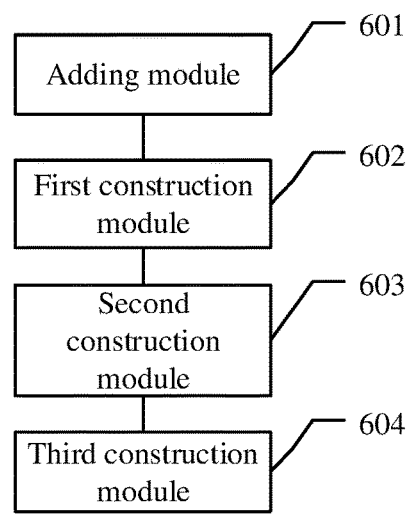
FIG. 9 is a schematic diagram of a structure of an apparatus for constructing a quantum circuit corresponding to a piecewise linear function according to an embodiment.

FIG. 9 is a schematic diagram of a structure of an option portfolio payoff calculation apparatus based on a quantum circuit according to an embodiment. Corresponding to the procedure shown in FIG. 5, the apparatus includes: an adding module 601, configured to add an independent variable of a target piecewise linear function on a first qubit; a first construction module 602, configured to construct, based on the first qubit and a breakpoint of the piecewise linear function, a first quantum sub-circuit for comparing the independent variable with an abscissa of the breakpoint; a second construction module 603, configured to construct, based on the first qubit and a comparison bit that is included in the first quantum sub-circuit and that is for outputting a comparison result, a piecewise quantum sub-circuit corresponding to each piece of the linear function in the piecewise linear function; and a third construction module 604, configured to construct, based on the first quantum sub-circuit and each piecewise quantum sub-circuit, the quantum circuit corresponding to the piecewise linear function.

Optionally, the adding module is configured to: for a probability distribution of the independent variable of the target linear function, obtain $2^N$ sampling points from the probability distribution, and add independent variable values and probabilities corresponding to the $2^N$ sampling points on N first qubits.

Optionally, the first construction module is configured to: obtain an auxiliary bit corresponding to the first qubit, and the comparison bit for outputting the comparison result; and determine, based on the abscissa of the breakpoint, a quantum logic gate of the to-be-constructed first quantum sub-circuit for comparing the independent variable with the abscissa of the breakpoint, and construct the first quantum sub-circuit in combination with the first qubit, the auxiliary bit, and the comparison bit.

Optionally, the second construction module is configured to: obtain a second qubit for outputting the piecewise linear function; correspondingly add, based on each piece of the linear function in the piecewise linear function, the parametric quantum logic gate acting on the second qubit, and determine the parameter value of the parametric quantum logic gate; and control the parametric quantum logic gate by using the first qubit and the comparison bit, to obtain the piecewise quantum sub-circuit corresponding to each piece of the linear function in the piecewise linear function.

Optionally, the piecewise linear function is a payoff function of a target option, and the apparatus further includes: a calculation module, configured to: run the quantum circuit, and calculate a payoff of the target option based on a running result of the quantum circuit.

Optionally, the calculation module is configured to: run a current quantum circuit, and measure a second qubit of the quantum circuit, to obtain an amplitude of the second qubit; and perform amplitude estimation on the amplitude of the second qubit, obtain an expectation value of the payoff function, and use the expectation value as the payoff of the target option.

Optionally, the apparatus further includes: a conversion module, configured to convert the payoff of the target option into a present value.

In an embodiment, representation of a linear function in the quantum computation field can be implemented, and the gaps in related technologies can be filled.

Another embodiment provides a storage medium. The storage medium stores a computer program. When the computer program is run, the steps in any method embodiment are performed.

Optionally, in this embodiment, the storage medium may be configured to store a computer program for performing the following steps: S11: Adding an independent variable of a target piecewise linear function on a first qubit. S12: Constructing, based on the first qubit and a breakpoint of the piecewise linear function, a first quantum sub-circuit for comparing the independent variable with an abscissa of the breakpoint. S13: Constructing, based on the first qubit and a comparison bit that is included in the first quantum sub-circuit and that is for outputting a comparison result, a piecewise quantum sub-circuit corresponding to each piece of the linear function in the piecewise linear function. S14: Constructing, based on the first quantum sub-circuit and each piecewise quantum sub-circuit, the quantum circuit corresponding to the piecewise linear function.

Another embodiment further provides an electronic apparatus, including a memory and a processor. The memory stores a computer program. The processor is configured to run the computer program, to perform the steps in any method embodiment.

Optionally, the electronic apparatus may further include a transmission device and an input/output device. The transmission device is connected to the processor. The input/output device is connected to the processor.

Optionally, in this embodiment, the processor may be configured to perform the following steps based on the computer program: S11: Adding an independent variable of a target piecewise linear function on a first qubit. S12: Constructing, based on the first qubit and a breakpoint of the piecewise linear function, a first quantum sub-circuit for comparing the independent variable with an abscissa of the breakpoint. S13: Constructing, based on the first qubit and a comparison bit that is included in the first quantum sub-circuit and that is for outputting a comparison result, a piecewise quantum sub-circuit corresponding to each piece of the linear function in the piecewise linear function. S14: Constructing, based on the first quantum sub-circuit and each piecewise quantum sub-circuit, the quantum circuit corresponding to the piecewise linear function.

Figure 10:
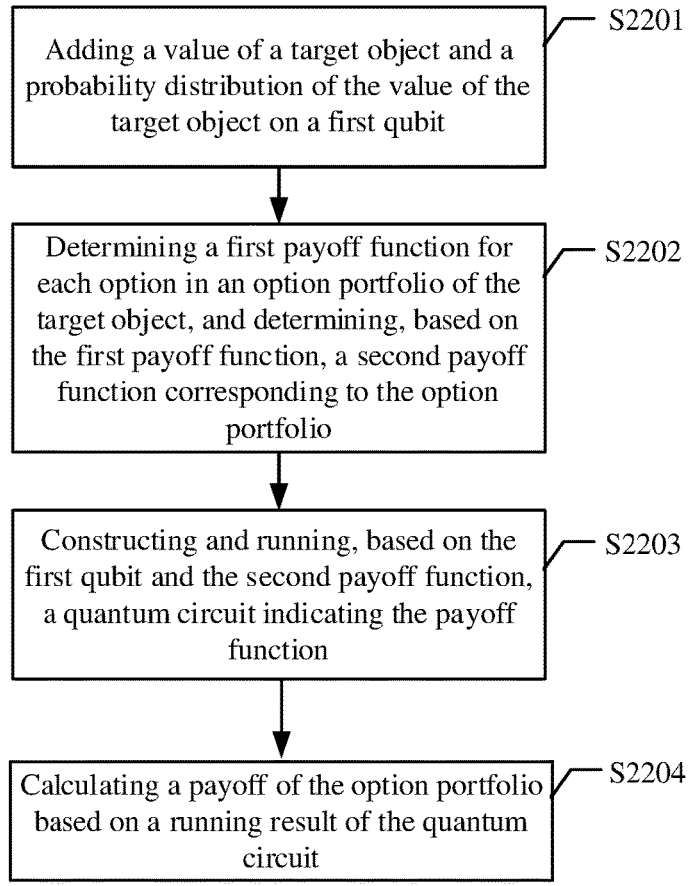
FIG. 10 is a schematic flowchart of an option portfolio payoff calculation method based on a quantum circuit according to an embodiment.

FIG. 10 is a schematic flowchart of an option portfolio payoff calculation method based on a quantum circuit according to an embodiment. The following steps may be included:

S2201: Adding a value of a target object and a probability distribution of the value of the target object on a first qubit.

Optionally, for the probability distribution of the value of the target object, $2^N$ sampling points are obtained from the probability distribution, and values and probabilities corresponding to the $2^N$ sampling points are added on N first qubits.

In actual application, a preferred manner of determining a sampling interval is as follows: obtaining a value mean and a value standard deviation corresponding to values in value probability distribution data; determining a left endpoint based on a difference between the value mean and three times the value standard deviation, and determining a right endpoint based on the left endpoint and six times the value standard deviation; and determining a sampling interval used for the $2^N$ sampling points based on the left endpoint and the right endpoint.

For a case of a relatively large sampling standard deviation error, the sampling interval can be correspondingly adjusted to further improve option estimation accuracy. First, the value mean and the value standard deviation of the values in the value probability distribution data are calculated. Then, the left endpoint is determined based on the difference between the value mean and three times the value standard deviation. To be specific, three times the value standard deviation is subtracted from the value mean, to determine the left endpoint of the sampling interval. Then, six times the value standard deviation is added based on the left endpoint, to obtain the right endpoint of the sampling interval. In the foregoing manner, an error caused due to interval selection can be greatly reduced when the value standard deviation is very large.

When the foregoing procedure is implemented, the determined left endpoint can be corrected based on whether the determined left endpoint falls within a distribution range of the sampled data, and the right endpoint can be determined based on the corrected left endpoint, to ensure integrity of the sampling interval. In this way, the following case is avoided: The sampling interval is narrowed due to constraints of actual sampling points.

Then, eigenstates corresponding to the N qubits (first qubits, or referred to as sampling bits) can be determined based on the values corresponding to the $2^N$ sampling points, and amplitude values of the eigenstates can be determined based on the value probabilities corresponding to the $2^N$ sampling points, to complete adding of each of the N qubits.

S2202: Determining a first payoff function for each option in an option portfolio of the target object, and determining, based on the first payoff function, a second payoff function corresponding to the option portfolio.

Optionally, for each option in the option portfolio, the value of the target object, a strike price, and an option cost can be substituted into a payoff function corresponding to the option, to obtain the first payoff function; and the first payoff functions respectively corresponding to the options can be combined, to obtain the second payoff function corresponding to the option portfolio.

For a plurality of option portfolios, specific values of the strike price and the option cost of each option are substituted into the corresponding payoff function, and the payoff function after the specific values are substituted is the first payoff function. Because the payoff functions are all piecewise linear functions, various first payoff functions can be linearly combined to obtain a second payoff function corresponding to the option portfolio. This may specifically include: processing the first payoff function corresponding to each option so that an option cost corresponding to a processed function is set to 0; based on a value of the strike price, determining a processed first payoff function of the option that has been combined and a processed first payoff function of the option that is to be combined, and determining a breakpoint array, a piece slope array, and a breakpoint function value array corresponding to the first payoff function of the option that has been combined; updating the breakpoint array, the piece slope array, and the breakpoint function value array based on each option, where an updated breakpoint array, an updated piece slope array, and an updated breakpoint function value array correspond to a second payoff function of an option portfolio without cost; and processing the second payoff function of the option portfolio without cost based on a cost price of each option, to obtain a second payoff function corresponding to an option portfolio with a cost.

For example, the user buys two options. One is buying a call option, and a first payoff function is as follows:

$$f_0(S_t) = \begin{cases} -1, & 0 < S_t \le 1 \\ S_t - 2, & 1 < S_t \end{cases}$$

Herein, a strike price $K_0$ is equal to 1, and an option cost $C_0$ is equal to 1.

The other is selling a call option, and a first payoff function is as follows:

$$f_1(S_t) = \begin{cases} 2, & 0 < S_t \le 2 \\ 4 - S_t, & 2 < S_t \end{cases}$$

Herein, a strike price $K_1$ is equal to 2, and an option cost $C_1$ is equal to 2.

A breakpoint, piece slopes, and a breakpoint function value can be used as parameters for representing a piecewise linear function. A specific combination manner of the first payoff function is as follows:

First, effect of an option cost in the first payoff function is eliminated. Processing is performed to obtain:

$$f'_0(S_t) = f_0(S_t) + C_0 = \begin{cases} 0, & 0 < S_t \le 1 \\ S_t - 1, & 1 < S_t \end{cases}; \text{ and}$$

$$f'_1(S_t) = f_1(S_t) - C_1 = \begin{cases} 0, & 0 < S_t \le 2 \\ 2 - S_t, & 2 < S_t \end{cases}.$$

For the foregoing two options, processed payoff functions of the options are traversed in an ascending order of strike prices, $f'_0(S_t)$ with a smallest strike price is used as the processed first payoff function of the option that has been combined (there is no option with a smaller strike price before $f'_0(S_t)$, which is equivalent to a combination with 0), and $f'_1(S_t)$ is used as the processed first payoff function of the option that is to be combined.

In this case, the breakpoint array (abscissae), the piece slope array, the breakpoint function value array are parameters of $f'_0(S_t)$, and are respectively {0, 1}, {0, 1}, and {0, 0}. It can be learned that an intersection point between the function and a horizontal coordinate axis is a strike price point.

If a strike price of a current option that is to be combined is different from a rightmost breakpoint (the point is a strike price point) of an option that has been combined, the strike price 2 of the current option that is to be combined is added to the breakpoint array to obtain {0, 1, 2}.

A sum of a function value of the strike price point and a product of a distance between the strike price point of the option that is to be combined and the strike price point of the option that has been combined and a piece slope of a part whose slope is not zero and that is in the option that has been combined is added to the breakpoint function value array: (2−1)*1+0=1, to obtain {0, 0, 1}.

If it is still determined that the current option that is to be combined is a call, a breakpoint function value remains unchanged. A value of adding 1 to the piece slope of the option that has been combined (if the current option that is to be combined is buying) or a value of subtracting 1 from the piece slope of the option that has been combined (if the current option that is to be combined is selling), that is, a slope 1−1=0 is added to the piece slope array, to obtain {0, 1, 0}.

Otherwise, if the current option that is to be combined is a put, a piece slope of a part whose slope is not zero and that is in the option that has been combined is added to the piece slope array, 1 is subtracted (if the current option that is to be combined is buying) from or added (if the current option that is to be combined is selling) to all piece slopes before being added to the piece slope array, and another value in the function value array is updated based on a new slope and a value added to the breakpoint function value array.

If the strike price of the current option that is to be combined is the same as the rightmost breakpoint of the option that has been combined (the strike prices are the same), the breakpoint remains unchanged, and the step of determining a call or a put is continuously performed.

In the foregoing manner, the breakpoint array {0, 1, 2}, the piece slope array {0, 1, 0}, and the breakpoint function value array {0, 0, 1} can be obtained after $f'_0(S_t)$ and $f'_1(S_t)$ are combined, to represent the payoff function after the combination.

$$f'_2(S_t) = \begin{cases} 0, & 0 < S_t \leq 1 \\ S_c - 1, & 1 < S_t \leq 2 \\ 1, & 2 < S_t \end{cases}$$

Finally, option costs of $f_0(S_t)$ and $f_1(S_t)$ are considered, to obtain the second payoff function corresponding to the option portfolio.

$$f_2(S_t) = f'_2(S_t) - C_0 + C_1 = \begin{cases} 1, & 0 < S_t \leq 1 \\ S_t, & 1 < S_t \leq 2 \\ 2, & 2 < S_t \end{cases}$$

The breakpoint array {0, 1, 2}, the piece slope array {0, 1, 0}, and the breakpoint function value array {1, 1, 2} corresponding to the second payoff function can be obtained.

S2203: Constructing and running, based on the first qubit and the second payoff function, a quantum circuit indicating the payoff function.

Optionally, the quantum circuit that includes the first qubit and that indicates the payoff function may be constructed; a preset parameter of the second payoff function may be input into the quantum circuit; and the current quantum circuit may be run, to obtain a running result of the current quantum circuit. The preset parameter may include: parameters used to indicate the breakpoint array, the piece slope array, and the breakpoint function value array of the second payoff function, a domain and a range of the second payoff function, and the like.

Optionally, the current quantum circuit may be run, and the second qubit of the current quantum circuit may be measured, to obtain an amplitude of the second qubit. The second qubit may be one preset qubit that is referred to as a result bit. More specifically, an amplitude of the second qubit may be an amplitude of the second qubit at a $|1\rangle$ state.

In an implementation, because the payoff function is a piecewise linear function, a first quantum sub-circuit for indicating each piece of the linear function and a second quantum sub-circuit (quantum comparator) for comparing values of an independent variable and an abscissa of a breakpoint may be constructed, to form the quantum circuit for indicating the piecewise linear function.

For the quantum comparator circuit, an abscissa of a breakpoint in the second payoff function other than an initial point 0 is a strike price, a value of the independent variable $S_T$ may be compared with a value of a strike price K, and a first quantum sub-circuit of a corresponding piece of the linear function is run based on a value comparison result.

For example, FIG. 6 is a schematic diagram of lines of a quantum comparator according to an embodiment. Because a value $S_t$ is added on N sampling bits, N auxiliary bits in a one-to-one correspondence with the N sampling bits need to be set as carry qubits in a comparison process. The carry qubit is used to store each bit corresponding to a quantum state of an encoding gain and a carry bit of each bit of a two's complement of a strike price.

Then, a quantum logic gate to act on each sampling bit and a corresponding auxiliary bit after adding is determined based on the binary complement of the strike price, and a result after an operation of each quantum logic gate is performed is added on a preset comparison bit.

Optionally, the quantum logic gate to act on each corresponding sampling bit and the corresponding auxiliary bit after adding may be sequentially determined based on an encoded value of each bit of the binary complement corresponding to the strike price. When an encoded value of one bit of the binary complement is 0, a corresponding quantum logic gate is a Toffoli gate. When an encoded value of one bit of the binary complement is 1, a corresponding quantum logic gate is a logic OR gate. It should be noted that only when an encoded value of the first bit of the binary complement is 0, it corresponds to no quantum logic gate operation; or when an encoded value of the first bit of the binary complement is 1, it corresponds to a CNOT gate operation.

As shown in FIG. 6, $|i_1\rangle$, $|i_2\rangle$, ..., and $|i_n\rangle$ are N sampling bits, $|i_1\rangle$ is a low-order bit, and $|i_n\rangle$ is a high-order bit; and $|a_1\rangle$, $|a_2\rangle$, ..., and $|a_n\rangle$ are auxiliary bits, $|a_1\rangle$ is a low-order bit, and $|a_n\rangle$ is a high-order bit; and C is a comparison bit. t[1, ..., n] represents an n-bit binary complement of the strike price, t[1] is a low-order bit, and t[n] is a high-order bit. A quantity of bits of the binary complement of the strike price, a quantity of auxiliary bits, and a quantity of sampling bits are the same in a one-to-one correspondence and are all N.

For example, as shown in FIG. 6, when t[1]=1, a quantum logic gate to act on the first sampling bit $|i_1\rangle$ and the first auxiliary bit $|a_1\rangle$ is determined to be a CNOT gate; or when t[1]=0, there is no need to perform any operation on the first auxiliary bit.

Quantum logic gates for t[2], t[3], . . . , and t[n] are determined based on the same idea. For example, as shown in a dotted-line box in FIG. 6, when t[2]=1, a quantum logic gate to act on the second sampling bit, the first auxiliary bit, and the second auxiliary bit is determined to be a logic OR gate; or when t[2]=0, a quantum logic gate to act on the second sampling bit, the first auxiliary bit, and the second auxiliary bit is determined to be a Toffoli gate.

By analogy, a quantum logic gate to act on the nth auxiliary bit $|a_n\rangle$ is determined. Then, $|a_n\rangle$ is added on the comparison bit by using the final CNOT gate. To be specific, a result of comparison between the value $S_t$ and a value of the strike price K is added on the comparison bit. For example, a $|0\rangle$ state is obtained after the comparison bit c is measured. It indicates that $S_t$ is less than K. Otherwise, a $|1\rangle$ state is obtained. It indicates that $S_t$ is greater than or equal to K.

After the quantum comparator circuit is run, a result of value comparison between the independent variable $S_T$ and the strike price K is obtained. Then, the first quantum sub-circuit is run, to obtain the amplitude of the second qubit of the first quantum sub-circuit.

Figure 11:
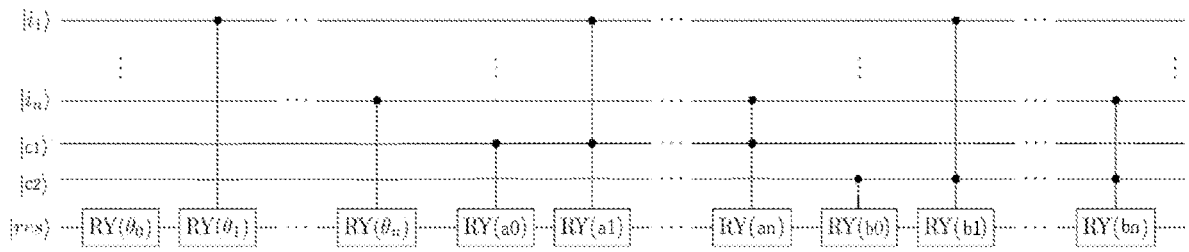
FIG. 11 is a schematic diagram of a first quantum sub-circuit according to an embodiment.

For example, the second payoff function $$f_2(S_t) = \begin{cases} 1, & 0 < S_t \le 1 \\ S_t, & 1 < S_t \le 2 \\ 2, & 2 < S_t \end{cases}$$

corresponds to the breakpoint array {0, 1, 2}, the piece slope array {0, 1, 0}, and the breakpoint function value array {1, 1, 2}. It can be learned that breakpoints 1 and 2 other than the initial point 0 are strike prices of two original options. It is assumed that K1=1 and K2=2. Two quantum comparator circuits are needed, and respectively correspond to the strike prices K1 and K2. Corresponding comparison bits are $c_1$ and $c_2$. The two quantum comparator circuits are run. A result of comparison between the independent variable $S_T$ and the strike price K1 and a result of comparison between the independent variable $S_T$ and the strike price K2 are obtained based on $c_1$ and $C_2$. Further, the first quantum sub-circuit is run. As shown in FIG. 11, the first quantum sub-circuit includes sampling bits: $i_1$, . . . , and $i_n$ obtained after adding, comparison bits $c_1$ and $c_2$, and a result bit res; and further includes three groups of quantum logic gates. A first group includes an $RY(\theta_0)$ gate, an $RY(\theta_1)$ gate actually controlled by $i_1$, . . . , and an $RY(\theta_n)$ gate actually controlled by $i_n$. Actual control (indicated by using a solid round point) indicates that a quantum logic gate is executed only when a quantum state of a controlling bit is a $|1\rangle$ state before the execution. The first group corresponds to a first piece of the piecewise linear function (second payoff function). A second group includes an $RY(a_0)$ gate, an $RY(a_1)$ gate actually controlled by $i_1$ and $c_1$, . . . , and an $RY(a_n)$ gate actually controlled by $i_n$ and $c_1$. The second group corresponds to a second piece of the piecewise linear function. A third group includes an $RY(b_0)$ gate, an $RY(b_1)$ gate actually controlled by ii and $c_2$, . . . , and an $RY(b_n)$ gate actually controlled by $i_n$ and $c_2$. The third group corresponds to a third piece of the piecewise linear function.

For the first group of logic gates, a parameter $\theta_0$ in the $RY(\theta_0)$ gate is mapped to a left-side breakpoint of the first piece of the linear function, and a parameter $\theta_1$ to a parameter $\theta_n$ in the $RY(\theta_1)$ gate to the $RY(\theta_n)$ gate are mapped to a slope of the first piece of the linear function. Parameters of the second group of logic gates and the third group of logic gates are similarly determined. It should be noted that $a_0$ is mapped to a function value obtained through subtracting a function value of a left-side breakpoint of the previous piece of the function from a function value of a left-side breakpoint of the second piece of the function, and $a_1$ to $a_n$ are mapped to a slope value obtained through subtracting a slope of the previous piece of the function from a slope of the second piece of the function. By analogy, a case for the third group is obtained. A person skilled in the art can understand that, in actual application, a value of the parameter of the RY gate, that is, the rotation angle ranges from 0 to $2\pi$, the value after the mapping can reflect the nature of a trigonometric function, and one-to-one mapping usually can be constructed on a monotonic interval of $\pi/4$.

The quantum comparator circuit and the first quantum sub-circuit are sequentially run, to finally measure the result bit res, thereby obtaining a corresponding quantum state and a corresponding amplitude.

S2204: Calculating a payoff of the option portfolio based on a running result of the quantum circuit.

Optionally, amplitude estimation may be performed on the amplitude of the second qubit, an expectation value $E[f(S_T)]$ of the second payoff function may be obtained, and the expectation value may be used as the payoff of the option portfolio.

The amplitude estimation can be implemented by using a quantum amplitude estimation algorithm QAE and an improved version or a variant of the quantum amplitude estimation algorithm. A preferred manner is specifically as follows: obtaining a current angle upper limit value and a current angle lower limit value corresponding to the amplitude value of the result bit, and calculating a first difference between the current angle upper limit value and the current angle lower limit value as a target difference; when the target difference is greater than a preset precision threshold, determining, based on a preset intermediate variable parameter, the current angle upper limit value, and the current angle lower limit value, a next angle amplification factor and a next flag parameter corresponding to a next iteration step; controlling a preset amplification quantum circuit to amplify a quantum circuit of the result bit by the next angle amplification factor, and measuring a quantum state of the result bit in a quantum circuit of an amplified result bit based on a preset total quantity of observation times; calculating a second difference between a next angle upper limit value and a next angle lower limit value of the amplitude value of the result bit as a target difference based on the current angle upper limit value, the current angle lower limit value, the next angle amplification factor, the next flag parameter, and a measured result of the quantum state of the result bit, until the target difference is not greater than the precision threshold; and determining the amplitude value of the result bit based on the measured result of the quantum state of the result bit.

In the amplitude value estimation method for the qubit (that is, the result bit) in the foregoing steps, an amplification parameter of an amplification quantum circuit in each iteration step is determined. Continuous iteration is performed, to make a difference between an angle upper limit value and an angle lower limit value not greater than the precision threshold. In this way, a problem that an amplitude value cannot converge is avoided, and precision of an estimated amplitude value is improved. For a principle of this process and a more detailed implementation process, refer to Chinese Patent Application No. 202011591351.6, filed on Dec. 29, 2020 and entitled "METHOD AND APPARATUS FOR AMPLITUDE ESTIMATION OF QUANTUM CIRCUIT, STORAGE MEDIUM, AND ELECTRONIC APPARATUS". Details are not described herein again.

In actual application, the amplitude of the second qubit may be a root $\sqrt{E[\tilde{f}(S_T)]}$ E, extracted from an expectation value of a linear function $\tilde{f}(S_T)$ of $S_T$. A linear formula is $$\tilde{f}(S_T) = c\frac{f(S_T) - f_{min}}{f_{max} - f_{min}} - c + \frac{1}{2} \cdot f_{max}$$

is a maximum value of $f(S_T)$, $f_{min}$ is a minimum value of $f(S_T)$, and c is a scale factor that may be determined according to an actual requirement, for example, to be 0.2. An expectation value $E[f(S_T)]$ of the second payoff function can be reversely obtained by using the linear formula.

Optionally, in actual application, the payoff of the option portfolio may be further converted into a present value. A conversion formula may be $E[f(S_T)]*e^{-rt}$.

Herein, an option payoff can be calculated based on a quantum circuit in a case of a large quantity of samples, to accelerate the calculation in parallel and improve the efficiency and the accuracy of option calculation. In addition, payoffs of a plurality of option portfolios are computable, thereby showing good versatility.

Figure 12:
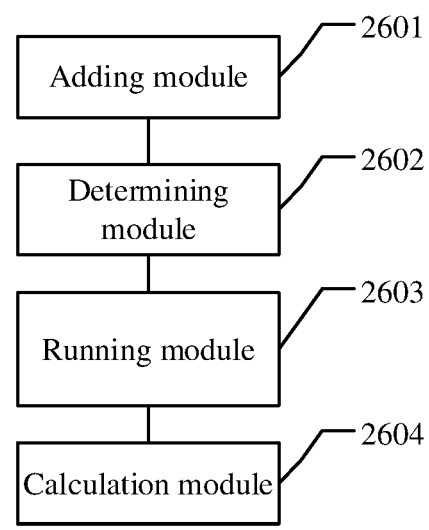
FIG. 12 is a schematic diagram of a structure of an option portfolio payoff calculation apparatus based on a quantum circuit according to an embodiment.

FIG. 12 shows an option portfolio payoff calculation apparatus based on a quantum circuit according to an embodiment. The apparatus includes: an adding module 2601, configured to add a value of a target object and a probability distribution of the value of the target object on a first qubit; a determining module 2602, configured to: determine a first payoff function for each option in an option portfolio of the target object, and determine, based on the first payoff function, a second payoff function corresponding to the option portfolio; a running module 2603, configured to construct and run, based on the first qubit and the second payoff function, a quantum circuit indicating the payoff function; and a calculation module 2604, configured to calculate a payoff of the option portfolio based on a running result of the quantum circuit.

Optionally, the adding module is configured to: for the probability distribution of the value of the target object, obtain $2^N$ sampling points from the probability distribution, and add values and probabilities corresponding to the $2^N$ sampling points on N first qubits.

Optionally, the determining module is configured to: for each option in the option portfolio, substitute the value of the target object, a strike price, and an option cost into a payoff function corresponding to the option, to obtain the first payoff function; and combine the first payoff functions respectively corresponding to the options, to obtain the second payoff function corresponding to the option portfolio.

Optionally, the running module includes: a construction unit, configured to construct the quantum circuit that includes the first qubit and that indicates the payoff function; an input unit, configured to input a preset parameter of the second payoff function into the quantum circuit; and a running unit, configured to run the current quantum circuit, to obtain the running result of the current quantum circuit.

Optionally, the running unit is configured to: run the current quantum circuit, and measure the second qubit of the current quantum circuit, to obtain an amplitude of the second qubit.

Optionally, the calculation module is configured to: perform amplitude estimation on the amplitude of the second qubit, obtain an expectation value of the second payoff function, and use the expectation value as the payoff of the option portfolio.

Optionally, the apparatus further includes: a conversion module, configured to convert the payoff of the option portfolio into a present value.

Herein, an option payoff can be calculated based on a quantum circuit in a case of a large quantity of samples, to accelerate the calculation in parallel and improve the efficiency and the accuracy of option calculation. In addition, payoffs of a plurality of option portfolios are computable, thereby showing good versatility.

Another embodiment provides a storage medium. The storage medium stores a computer program. When the computer program is run, the steps in any method embodiment are performed.

Optionally, in this embodiment, the storage medium may be configured to perform the following steps based on the computer program: S21: Adding a value of a target object and a probability distribution of the value of the target object on a first qubit. S22: Determining a first payoff function for each option in an option portfolio of the target object, and determining, based on the first payoff function, a second payoff function corresponding to the option portfolio. S23: Constructing and running, based on the first qubit and the second payoff function, a quantum circuit indicating the payoff function. S24: Calculating a payoff of the option portfolio based on a running result of the quantum circuit.

Another embodiment further provides an electronic apparatus, including a memory and a processor. The memory stores a computer program. The processor is configured to run the computer program, to perform the steps in any method embodiment.

Optionally, the electronic apparatus may further include a transmission device and an input/output device. The transmission device is connected to the processor. The input/output device is connected to the processor.

Optionally, in this embodiment, the processor may be configured to perform the following steps based on the computer program: S21: Adding a value of a target object and a probability distribution of the value of the target object on a first qubit. S222: Determining a first payoff function for each option in an option portfolio of the target object, and determining, based on the first payoff function, a second payoff function corresponding to the option portfolio. S3: Constructing and running, based on the first qubit and the second payoff function, a quantum circuit indicating the payoff function. S24: Calculating a payoff of the option portfolio based on a running result of the quantum circuit.

The constructions, features, functions, and effect of the present application are described in detail in the embodiments with reference to the accompanying drawings. The foregoing is merely preferred embodiments of the present application, and the present application is not limited by the accompanying drawings. All equivalent embodiments that are modified or changed according to the concept of the present application and do not depart from the spirit of the specification and the drawings should fall within the protection scope of the present application.

What is claimed is:

1. A method for constructing a quantum circuit corresponding to a linear function, comprising:
    adding an independent variable of a target linear function on a first qubit;
    obtaining a second qubit for outputting the target linear function, adding a parametric quantum logic gate acting on the second qubit, and controlling the parametric quantum logic gate by using the first qubit; and
    determining a parameter value of the parametric quantum logic gate based on the target linear function, to obtain a quantum circuit corresponding to the target linear function.

2. The method according to claim 1, wherein the adding an independent variable of a target linear function on a first qubit comprises:
    for a probability distribution of the independent variable of the target linear function, obtaining 2N sampling points from the probability distribution, and adding independent variable values and probabilities corresponding to the 2N sampling points on N first qubits.

3. The method according to claim 1, wherein the adding a parametric quantum logic gate acting on the second qubit, and controlling the parametric quantum logic gate by using the first qubit comprises:
    adding a first parametric quantum logic gate corresponding to an intercept of the target linear function, wherein the first parametric quantum logic gate acts on the second qubit; and
    separately adding a second parametric quantum logic gate corresponding to a slope of the target linear function, wherein one first qubit corresponds to one second parametric quantum logic gate, and the second parametric quantum logic gate acts on the second qubit and is controlled by a corresponding first qubit.

4. The method according to claim 3, wherein the determining a parameter value of the parametric quantum logic gate based on the target linear function comprises:
    determining a parameter value of the first parametric quantum logic gate based on the intercept of the target linear function; and
    determining a parameter value of the second parametric quantum logic gate based on the slope of the target linear function.

5. The method according to claim 1, wherein the parametric quantum logic gate is an RY gate.

6. The method according to claim 1, wherein the linear function is a piecewise linear function, and the method further comprises:
    constructing, based on the first qubit and a breakpoint of the piecewise linear function, a first quantum sub-circuit for comparing the independent variable with an abscissa of the breakpoint;
    wherein the obtaining a second qubit for outputting the target linear function, adding a parametric quantum logic gate acting on the second qubit, and controlling the parametric quantum logic gate by using the first qubit comprises:
        constructing, based on the first qubit and a comparison bit that is comprised in the first quantum sub-circuit and that is for outputting a comparison result, a piecewise quantum sub-circuit corresponding to each piece of the linear function in the piecewise linear function; and
    wherein the determining a parameter value of the parametric quantum logic gate based on the target linear function, to obtain a quantum circuit corresponding to the target linear function comprises:
        constructing, based on the first quantum sub-circuit and each piecewise quantum sub-circuit, the quantum circuit corresponding to the piecewise linear function.

7. The method according to claim 6, wherein the constructing, based on the first qubit and a breakpoint of the piecewise linear function, a first quantum sub-circuit for comparing the independent variable with an abscissa of the breakpoint comprises:
    obtaining the second qubit for outputting the piecewise linear function;
    obtaining an auxiliary bit corresponding to the first qubit, and the comparison bit for outputting the comparison result; and
    determining, based on the abscissa of the breakpoint, a quantum logic gate of the to-be-constructed first quantum sub-circuit for comparing the independent variable with the abscissa of the breakpoint, and constructing the first quantum sub-circuit in combination with the first qubit, the auxiliary bit, and the comparison bit.

8. The method according to claim 6, wherein the constructing, based on the first qubit and a comparison bit that is comprised in the first quantum sub-circuit and that is for outputting a comparison result, a piecewise quantum sub-circuit corresponding to each piece of the linear function in the piecewise linear function comprises:
    obtaining the second qubit for outputting the piecewise linear function;
    correspondingly adding, based on each piece of the linear function in the piecewise linear function, the parametric quantum logic gate acting on the second qubit, and determining the parameter value of the parametric quantum logic gate; and
    controlling the parametric quantum logic gate by using the first qubit and the comparison bit, to obtain the piecewise quantum sub-circuit corresponding to each piece of the linear function in the piecewise linear function.

9. The method according to claim 6, wherein the piecewise linear function is a payoff function of a target option, and the method further comprises:
    running the quantum circuit, and calculating a payoff of the target option based on a running result of the quantum circuit.

10. The method according to claim 9, wherein the running the quantum circuit, and calculating a payoff of the target option based on a running result of the quantum circuit comprises:
    running a current quantum circuit, and measuring the second qubit of the quantum circuit, to obtain an amplitude of the second qubit; and
    performing amplitude estimation on the amplitude of the second qubit, obtaining an expectation value of the payoff function, and using the expectation value as the payoff of the target option.

11. The method according to claim 9, wherein the method further comprises:
    converting the payoff of the target option into a present value.

12. An apparatus for constructing a quantum circuit corresponding to a linear function, wherein the apparatus comprises:
    an adding module, configured to add an independent variable of a target linear function on a first qubit;

an addition module, configured to: obtain a second qubit for outputting the target linear function, add a parametric quantum logic gate acting on the second qubit, and control the parametric quantum logic gate by using the first qubit; and a determining module, configured to determine a parameter value of the parametric quantum logic gate based on the target linear function, to obtain a quantum circuit corresponding to the target linear function.

13. The apparatus according to claim 12, wherein the adding module is configured to:

for a probability distribution of the independent variable of the target linear function, obtain 2N sampling points from the probability distribution, and add independent variable values and probabilities corresponding to the 2N sampling points on N first qubits.

14. The apparatus according to claim 12, wherein the addition module is configured to:

add a first parametric quantum logic gate corresponding to an intercept of the target linear function, wherein the first parametric quantum logic gate acts on the second qubit; and separately add a second parametric quantum logic gate corresponding to a slope of the target linear function, wherein one first qubit corresponds to one second parametric quantum logic gate, and the second parametric quantum logic gate acts on the second qubit and is controlled by a corresponding first qubit.

15. A non-transitory storage medium, wherein the non-transitory storage medium stores a computer program, and when the computer program is run, the method according to claim 1 is performed.

16. An electronic apparatus, comprising a memory and a processor, wherein the memory stores a computer program, and the processor is configured to run the computer program, so that the method according to claim 1 is performed.

* * * * *